United States Patent
Guo et al.

(10) Patent No.: US 9,714,973 B2
(45) Date of Patent: Jul. 25, 2017

(54) SHORT CIRCUIT DETECTION MODULE

(71) Applicant: STMICROELECTRONICS ASIA PACIFIC PTE LTD, Singapore (SG)

(72) Inventors: Dianbo Guo, Singapore (SG); EngJye Ng, Singapore (SG); Abhishek Singh, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 401 days.

(21) Appl. No.: 14/550,415

(22) Filed: Nov. 21, 2014

(65) Prior Publication Data

US 2016/0146874 A1    May 26, 2016

(51) Int. Cl.
| | |
|---|---|
| G01R 31/08 | (2006.01) |
| G01R 31/28 | (2006.01) |
| G01R 31/02 | (2006.01) |
| G06F 3/041 | (2006.01) |
| G06F 3/044 | (2006.01) |

(52) U.S. Cl.
CPC ......... *G01R 31/025* (2013.01); *G01R 31/024* (2013.01); *G01R 31/08* (2013.01); *G06F 3/044* (2013.01); *G06F 3/0418* (2013.01); *G06F 2203/04111* (2013.01)

(58) Field of Classification Search
CPC ...... G01R 31/00; G01R 31/002; G01R 31/02; G01R 31/024; G01R 31/025; G01R 31/08; G01R 31/28; G01R 27/26; G01R 27/2605; G06F 3/0414; G06F 3/0418; G06F 3/044; G06F 2203/04111; H04L 41/0677; G01D 5/24; G01D 5/241; G01D 5/2412; G01D 5/2417; G06K 9/0002; H03K 17/955

USPC ....... 324/500, 509, 512, 527, 528, 531, 555, 324/519, 548, 658, 686; 345/173, 174; 702/47, 52

See application file for complete search history.

(56) References Cited

U.S. PATENT DOCUMENTS

| | | | | |
|---|---|---|---|---|
| 4,734,651 A | * | 3/1988 | Keller et al. ......... | G01R 31/045 324/519 |
| 5,175,504 A | * | 12/1992 | Henley ................. | G09G 3/006 219/121.68 |
| 5,787,044 A | * | 7/1998 | Duesman ............ | G11C 11/4074 365/149 |
| 6,056,384 A | * | 5/2000 | Sato et al. ............. | H02P 7/04 318/400.21 |
| 8,604,798 B2 | | 12/2013 | Casillan et al. | |

(Continued)

*Primary Examiner* — Hoai-An D Nguyen
(74) *Attorney, Agent, or Firm* — Seed IP Law Group LLP

(57) ABSTRACT

A microelectronic short circuit detection module is disclosed that locates and distinguishes among different types of short circuits in touch screen panels. Individual short circuit detection circuits are coupled to force and sense lines throughout a wire matrix within the touch screen. If the line is shorted to a neighboring line or any other line carrying an opposite logic state, its logic state will be corrupted by the short and will be held at a value opposite that of the intended input signal. Comparing the input and the output therefore provides an indicator of a short circuit to another force or sense line in the wire matrix. A pair of pull up/down stages is engaged to detect whether the short is coupled to power or ground. A threshold resistor can be varied to adjust detection sensitivity. By conducting a serial test, matrix coordinates of the short circuit can be identified.

20 Claims, 8 Drawing Sheets

(56) References Cited

U.S. PATENT DOCUMENTS

| | | | |
|---|---|---|---|
| 2002/0105356 A1* | 8/2002 | Genna et al. | H03K 19/01858 326/57 |
| 2006/0219553 A1* | 10/2006 | Ieda et al. | G01N 33/007 204/424 |
| 2007/0018719 A1* | 1/2007 | Seven | H03F 1/0277 330/51 |
| 2007/0067092 A1* | 3/2007 | Burkatovsky | G05B 19/0425 701/114 |
| 2007/0200831 A1* | 8/2007 | Wang | G06F 3/0416 345/173 |
| 2009/0308683 A1* | 12/2009 | Suzuki | B62D 5/0463 180/446 |
| 2012/0181931 A1* | 7/2012 | Katsura | B60Q 11/005 315/82 |
| 2013/0342220 A1* | 12/2013 | Shimizu | G01R 27/2605 324/658 |
| 2015/0171779 A1* | 6/2015 | Forscht et al. | G01R 31/40 318/400.29 |
| 2015/0241195 A1* | 8/2015 | Schenkewitz | H03K 17/975 324/658 |

* cited by examiner

SHORT CIRCUIT DETECTION MODULE

BACKGROUND

Technical Field

The present disclosure generally relates to touch sensitive displays, and in particular, to detecting short circuits in a capacitive sensor touch screen.

Description of the Related Art

Touch-sensitive glass display panels, or touch screens, are common elements of mobile electronic devices such as smart phones, tablet computers, user interface panels, and the like. Touch screens rely on capacitive sensors to sense a user touching a particular location on the touch screen using a finger or a stylus. Embedded in the touch screen, underneath the glass surface with which the user interacts, is a matrix of conducting wire. The matrix is made up of sense lines arranged in columns overlaying force lines, arranged in rows. Sense lines and force lines reside in different layers of the touch screen, separated by an insulating thin film. Short circuits between adjacent sense lines or adjacent force lines, or between sense lines and force lines, cause the touch screen to malfunction. Thus, it is generally advantageous to monitor the touch screen electrically to detect the presence of short circuits. An example of an existing short circuit detection module for touch panels is described in U.S. Pat. No. 8,604,798 (hereinafter, the '798 patent) to Casillan et al., and assigned to the assignee of this patent application, and is hereby incorporated by reference in its entirety.

BRIEF SUMMARY

A microelectronic short circuit detection module is disclosed that can detect and distinguish among different types of short circuits that occur in electronic devices equipped with touch screen panels. Once the presence and/or type of short circuit is detected, the short circuit detection module can continue testing to determine the location of the short circuit. Error codes indicating the presence, location, and type of short circuit can reside in the firmware of the electronic device in which the short circuit detection module is deployed. If desired, an alert can be provided to a user, with information about the short circuit.

The short circuit detection module includes a plurality of individual short circuit detection circuits, each detection circuit coupled to a different force or sense line throughout the touch panel matrix. In one embodiment, each short circuit detection circuit includes a first pull up/down stage, a second pull up/down stage, and a comparator. The short circuit detection circuit is inserted between the drive signal, or input, and the force or sense line being driven, so that the output of the short circuit detection circuit is coupled to the force or sense line. Adjacent sense lines and adjacent force lines in a touch screen panel normally have opposite logic states. Thus, if the force/sense line being driven by a particular detection circuit is shorted to an adjacent line, its logic state will be corrupted by the short and will be held at a value opposite that of the intended input signal. Comparing the input and the output logic states of the detection circuit therefore provides an indicator of a short circuit affecting the respective force/sense line to which the detection circuit is coupled. Thus, a short circuit is indicated if IN and OUT are not at the same logic state (IN≠OUT). A comparator employs an exclusive OR (XOR) logic gate to compare IN and OUT to detect shorts to other lines within the capacitive sensing matrix, while the pull up/down stages are engaged to detect whether the short is coupled to power or ground. A short circuit threshold resistor, $R_T$, can be varied to adjust sensitivity of the detector. By operating individual short circuit detection circuits in a serial fashion, the location of the short circuit can be identified.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of electronic device testing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to a binary logic state '1' is used interchangeably with the term 'high', as is customary in the art. Likewise, reference throughout the specification to a binary logic state '0' is used interchangeably with the term low'.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Specific embodiments are described herein with reference to short circuit detector hardware and testing methods that have been produced; however, the present disclosure and the reference to certain materials, dimensions, and the details and ordering of processing steps are exemplary and should not be limited to those shown.

Figure 1:
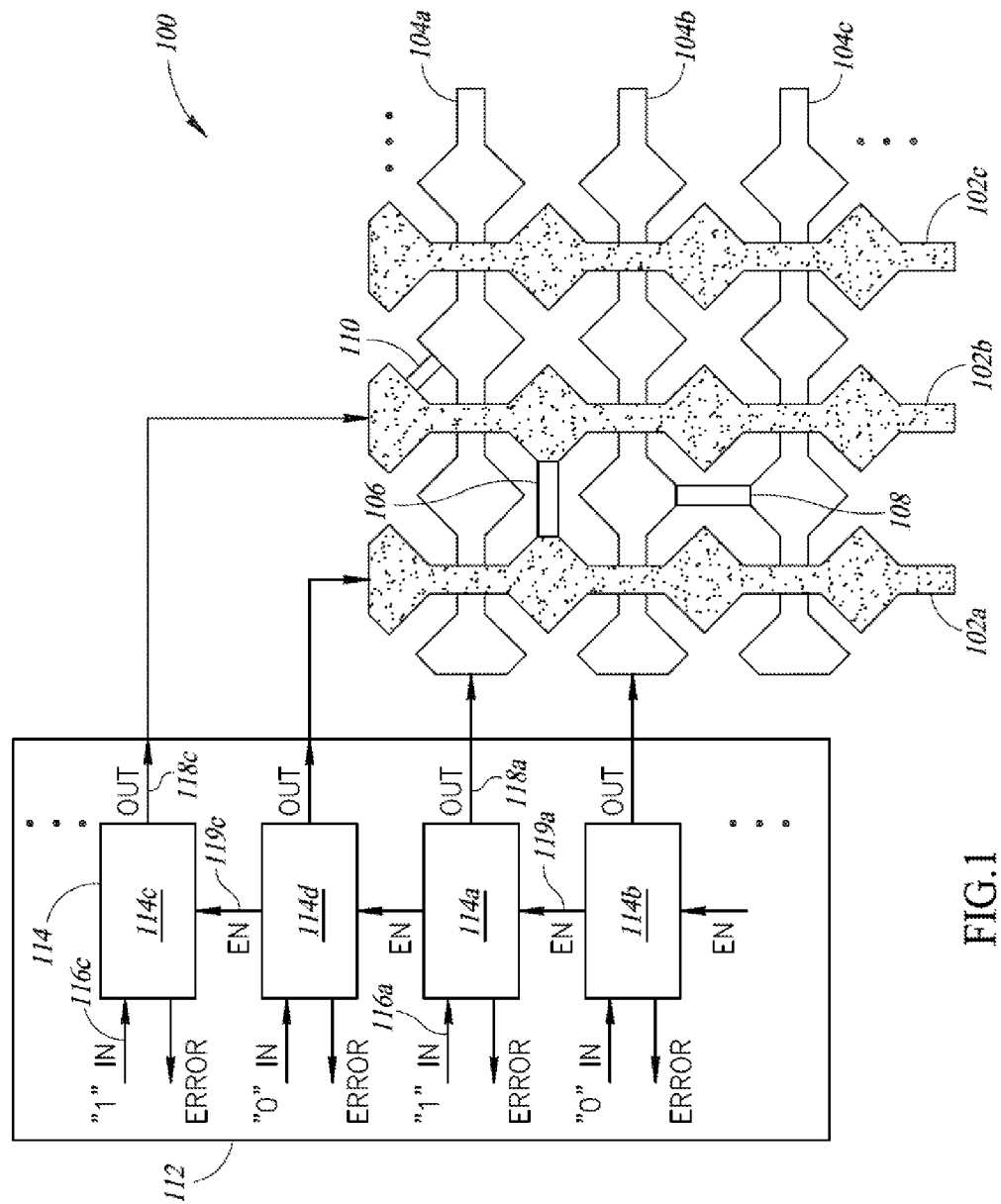
FIG. 1 is a block diagram of a short circuit detection module coupled to detect short circuits in a capacitive sensing matrix, according to one embodiment described herein.

FIG. 1 shows a capacitive sensing matrix 100 of conducting wires for use in a touch screen, according to one embodiment. The capacitive sensing matrix 100 is positioned underneath a glass touch-sensitive screen that forms a user interface for an electronic device. Such electronic devices include mobile phones, smart phones, laptop computers, tablet computers, and desktop computers, as well as interactive display screens used in various monitors, televisions, billboards, vehicle dashboard displays, appliance control panels, and the like.

The capacitive sensing matrix 100 includes sense lines 102 (three shown, 102a, 102b, 102c), which are conducting wires arranged in columns. The sense lines 102 are formed in a first conducting layer. The capacitive sensing matrix 100 also includes force lines 104 (three shown, 104a, 104b, 104c), which are conducting wires arranged in rows. In the example shown, the force lines 104 are formed in a second conducting layer underlying the first conducting layer. The two conducting layers are spaced apart from one another by an insulating layer (not shown). In other embodiments, the force and sense lines can have different orientations from those shown in FIG. 1. Likewise, in other embodiments, the second conducting layer in which the force lines 104 are formed can overlie the first conducting layer in which the sense lines are formed.

As advances in technology cause the dimensions of electronic devices to shrink, spaces between adjacent sense lines and adjacent force lines in the capacitive sensing matrix 100 tend to become more and more compressed. As a result, unintended conducting paths can form between conducting wires in proximity to one another, producing a short circuit. Such short circuits can be caused by, for example, manufacturing defects or damage to the insulating layer during use. FIG. 1 illustrates an exemplary sense/sense short circuit connection 106 formed between adjacent sense lines 102, and an exemplary force/force short circuit connection 108 formed between adjacent force lines 104. As the layers become thinner, short circuits can develop between force lines 104 and sense lines 102 that are formed in adjacent layers, as illustrated by the exemplary force/sense short circuit connection 110.

FIG. 1 further illustrates a short circuit detection module 112 coupled to the capacitive sensing matrix 100. In some embodiments, the short circuit detection module 112 can be coupled to a wire matrix that is similar in its basic structure to the capacitive sensing matrix 100, but has a different application. The short circuit detection module 112 includes a plurality of short circuit detection circuits 114 as described herein (four shown, 114a, 114b, 114c, and 114d). The short circuit detection circuits 114a, 114b are shown coupled to force lines of the capacitive sensing matrix 100, while the short circuit detection circuits 114c, 114d are shown coupled to sense lines of the capacitive sensing matrix 100. The short circuit detection circuits 114 can be used to detect short circuits in the capacitive sensing matrix 100. The short circuit detection module 112 can also be used to detect short circuits in other contexts, not limited to capacitive sensing devices or touch screen applications. It is noted that short circuit detection circuits 32 as described in the '798 patent are configured and operated differently from the short circuit detection circuits 114 as described herein.

Inputs to each short circuit detection circuit 114 include an input signal ("IN") 116, an output signal ("OUT") 118, an enable signal ("EN") 119, and an error signal ("ERROR") 120. Each short circuit detection circuit 114 is coupled to drive a conducting wire in the capacitive sensing matrix 100 to the logic value, "1" or "0", of its respective input signal 116. Under normal operation, adjacent force lines in the capacitive sensing matrix 100 are driven to opposite logic levels, thus creating an alternating 1-0-1-0 signal pattern throughout the capacitive sensing matrix 100. For example, FIG. 1 shows that the input signal 116a to the short circuit detection circuit 114a has a logic value "1" and the corresponding output signal 118a is coupled to the force line 104a to drive the force line 104a to a logic "1" state. Similarly, the input signal 116b to the short circuit detection circuit 114b has a logic value "0" and the corresponding output signal 118b is coupled to the force line 104b to drive the force line 104b to a logic "0" state. By design, the input signal 116 of each short circuit detection circuit should match its output value (i.e., IN=OUT). IN≠OUT indicates that the respective force line is corrupted by a neighboring line, thus indicating the presence of a short circuit. Alternatively, the respective force line may be shorted to power or ground. For example, 118b should be at a logic "0" state to match the input value 116b. However, the presence of the force/force short circuit 108 could cause 118b to be at a logic "1" state instead. In response to an enable signal 119b that sets EN="1", the short circuit detection circuit 114b performs a comparison of an input value 116b and an output value 118b and finds that IN≠OUT, thus detecting the presence of a short circuit somewhere in the capacitive sensing matrix 100 that is corrupting the logic state of force line 104b. The result of the comparison appears at the ERROR output as a logic "1" if a short circuit is detected, and '0' if a short circuit is not detected.

Using the circuits and methods described herein, it is further possible to locate the short circuit within the capacitive sensing matrix 100. The location of the short circuit can be deduced by sequentially enabling the short circuit detection circuits 114 to perform tests of all of the force/sense lines 102 and 104 in succession using both IN=1 and IN=0 conditions, and analyzing the resulting ERROR output data for commonalities. Furthermore, performing a comprehensive series of tests permits detection of force/sense shorts between different conducting layers, in addition to adjacent force/force and sense/sense shorts. It is noted that short circuits could occur between lines in the sensing matrix 100 that are separated from one another (e.g., non-adjacent lines) if, for example, a crack forms in the insulating material between any two lines, and moisture becomes trapped in the crack.

Figure 2:
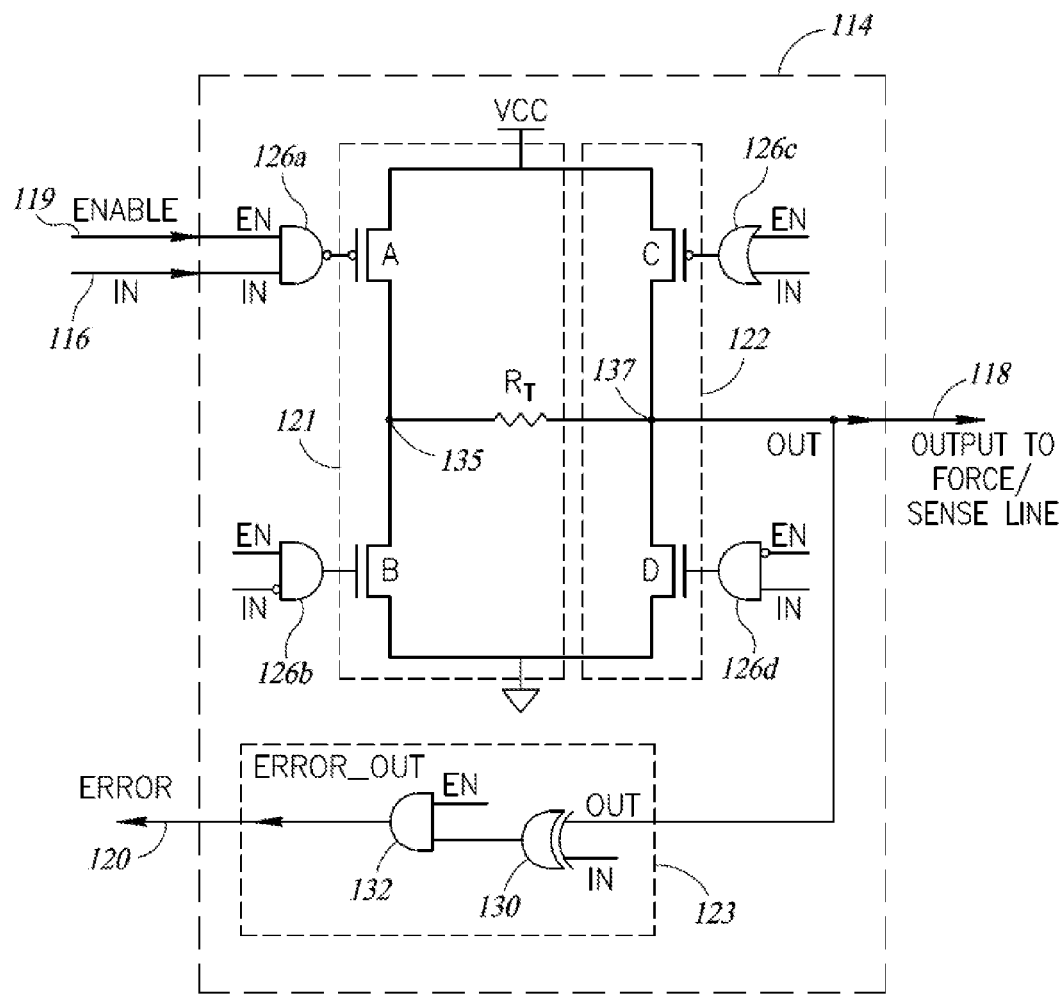
FIG. 2 is a schematic diagram of a short circuit detection circuit, according to one exemplary embodiment described herein.

FIG. 2 shows a detailed circuit diagram of the short circuit detection circuit 114, according to one embodiment. The short circuit detection circuit 114 includes a first pull up/down stage 121, a second pull up/down stage 122, a threshold resistor $R_T$, and a comparator stage 123.

The first pull up/down stage 121 includes a PMOS pull-up transistor A and an NMOS pull-down transistor B, each coupled to an input node 135. When transistor A turns on, the input node 135 is coupled to $V_{cc}$, thus pulling the input node high. When transistor B turns on, the input node 135 is coupled to ground, thus pulling the input node 135 low. The first pull up/down stage 121 further includes an AND gate coupled to the NMOS transistor B and a NAND gate coupled to the PMOS transistor A.

The second pull up/down stage 122 includes a PMOS pull-up transistor C and an NMOS pull-down transistor D, each coupled to an output node 137. When transistor C turns on, the output node 137 is coupled to $V_{cc}$, thus pulling the output node 137 high. When transistor D turns on, the output node 137 is coupled to ground, thus pulling the output node 137 low. The second pull up/down stage 122 further includes an AND gate coupled to the NMOS transistor D and an OR gate coupled to the PMOS transistor C.

The comparator stage 123 includes an exclusive OR (XOR) logic gate 130 and an AND gate 132. The XOR logic gate 130 compares the two signals IN and OUT to determine whether they are the same or different. When the test is enabled by setting the enable signal EN=1, the AND gate 132 is triggered to transmit the result of the XOR comparison. If IN=OUT, the output of XOR logic gate 130 is a logic 0, indicating no error and hence no short circuit. The resulting logic "0" then appears at the error output of the comparator stage 123. If IN 0 OUT, the output of XOR logic gate 130 is a logic 1, indicating an error and hence a short circuit. The resulting logic "1" then appears at the error output of the comparator stage 123. Whenever EN=0, meaning a test is not being performed, the AND gate 132 causes a logic "0" to appear at the comparator stage error output, indicating no short circuit. Thus, availability of the comparator stage error signal 120 is gated by the enable signal EN 119.

The first and second pull up/down stages 121 and 122, respectively, are electrically coupled by a threshold resistor $R_T$ inserted between the input node 135 and the output node 137. A short circuit threshold is determined by the resistor such that the resistor serves as a sensitivity adjustment for the short circuit detection circuit 114. It may be advantageous, therefore, to implement the short circuit detection circuit 114 using a variable threshold resistor for $R_T$.

Figure 3:
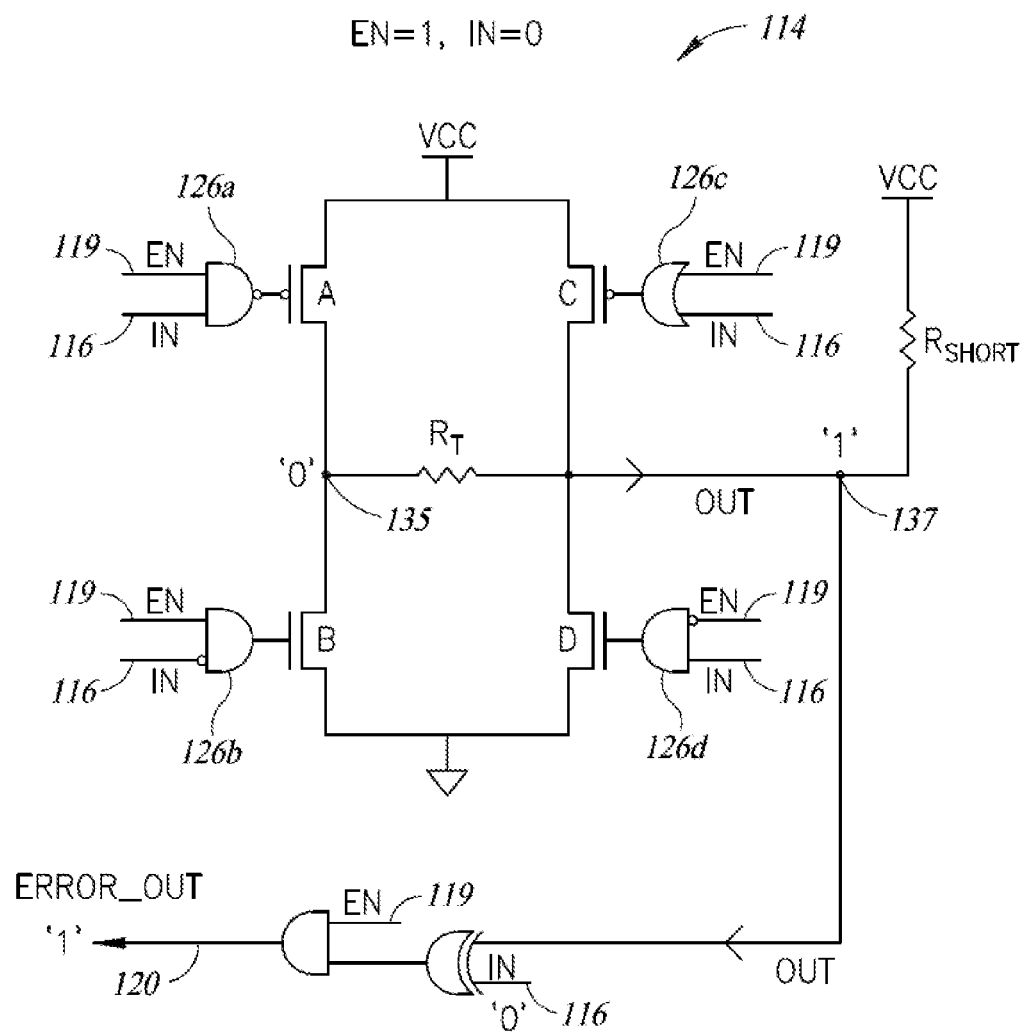
FIG. 3 is a schematic diagram of the short circuit detection circuit of FIG. 2, shown in use during a short circuit test in which the load under test is shorted to a power supply.
Figure 4:
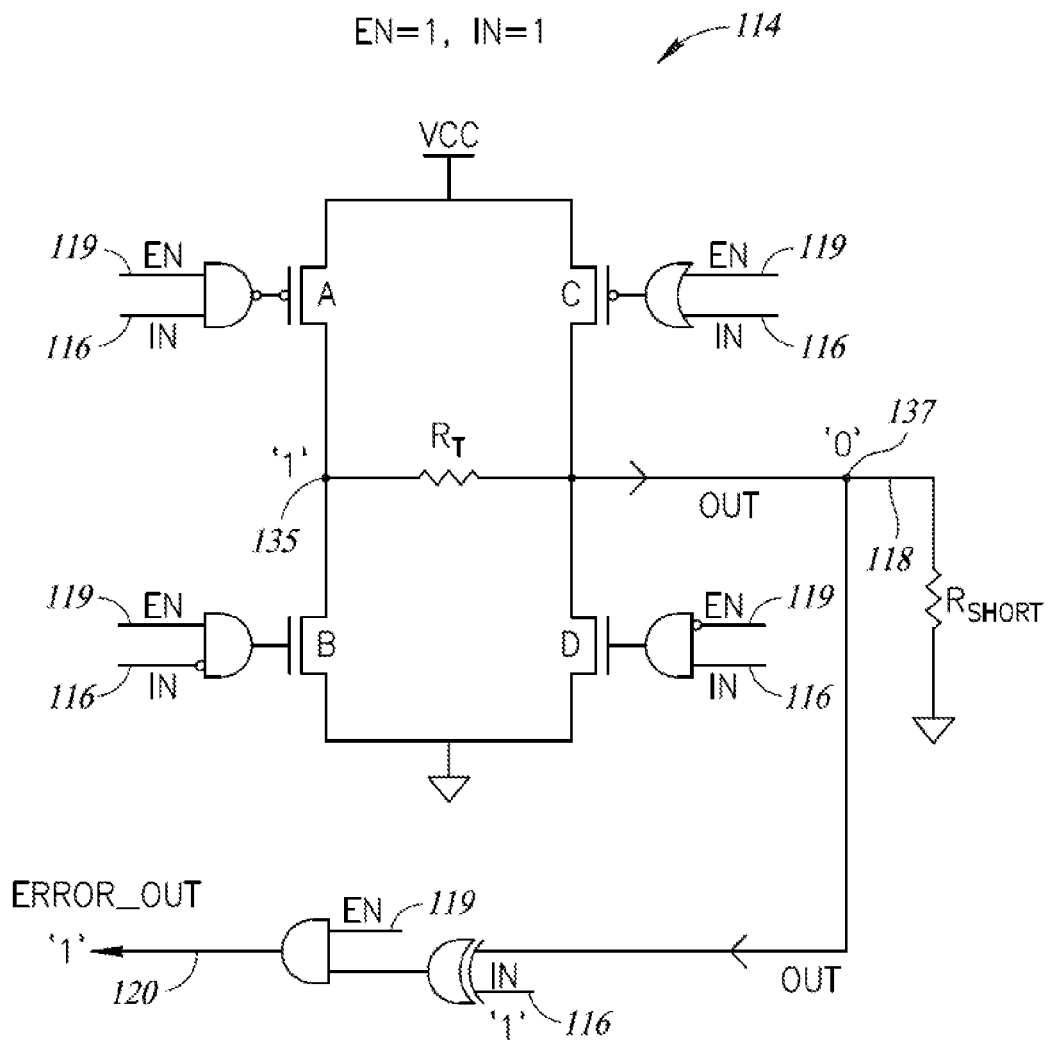
FIG. 4 is a schematic diagram of the short circuit detection circuit of FIG. 2, shown in use during a short circuit test in which the load under test is shorted to ground.

FIGS. 3 and 4 illustrate the use of the particular short circuit detection circuit 114 to detect short circuits to power and ground, respectively. Detecting short circuits to power or ground has been done successfully using other circuit implementations, such as those described in U.S. Pat. No. 8,604,798.

In FIG. 3, the force/sense line under test, coupled to output node 137, is shorted to $V_{cc}$ through a resistance $R_{short}$. The short circuit causes OUT=1, while the input signal 116 attempts to drive the force line to a low state, so that IN=0. Thus, despite application of the input signal IN=0, the output node 135 remains high. Setting EN=1 latches the input signal 116 into the first pull up/down stage 121 via the logic gates 126a, 126b, thus switching the transistors A, B appropriately so that the value IN appears at the input node 135. Setting EN=1 in the second pull up/down stage 122 causes the transistors C, D to switch off, effectively disabling the second pull up/down stage 122 so that the value of the output node 137, is governed by $V_{cc}$. Setting EN=1 in the comparator stage 123 latches the result of the XOR comparison through the AND gate 132, thereby producing an error state "1" at the error output 120, indicating presence of a short circuit.

In FIG. 4, the force/sense line under test, coupled to output node 137 is shorted to ground through a resistance $R_{short}$. The short circuit causes OUT=0, while the input signal 116 attempts to drive the line to a high state, so that IN=1. Thus, despite application of the input signal IN=1, the output node 137 remains low. The consequences of setting EN=1 in the pull up/down circuits 121 and 122 are similar to those for the case described above with reference to FIG. 3, i.e., the value of IN appears at the input node 135 and the second pull up/down stage is disabled so that the value of the output node 137 is tied to ground through $R_{short}$. Again, setting EN=1 in the comparator stage 123 latches the result of the XOR comparison through the AND gate 132, thereby producing an error state "1" at the error output 120, again indicating presence of a short circuit.

Figure 5:
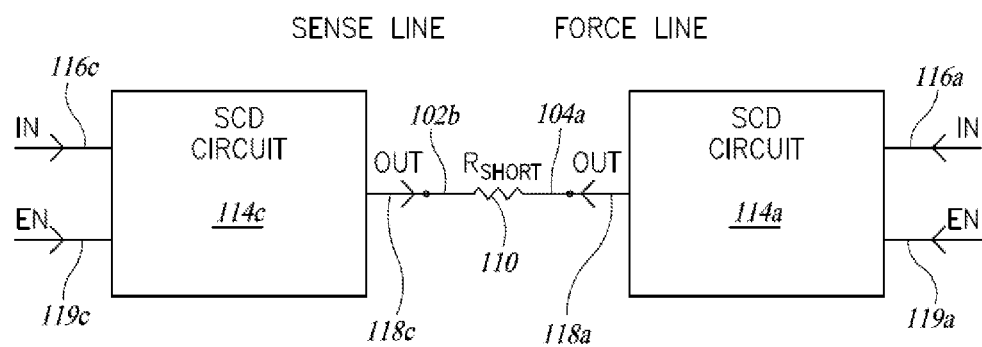
FIG. 5 is a circuit schematic diagram that illustrates the exemplary force/sense short circuit shown in FIG. 1.
Figure 6:
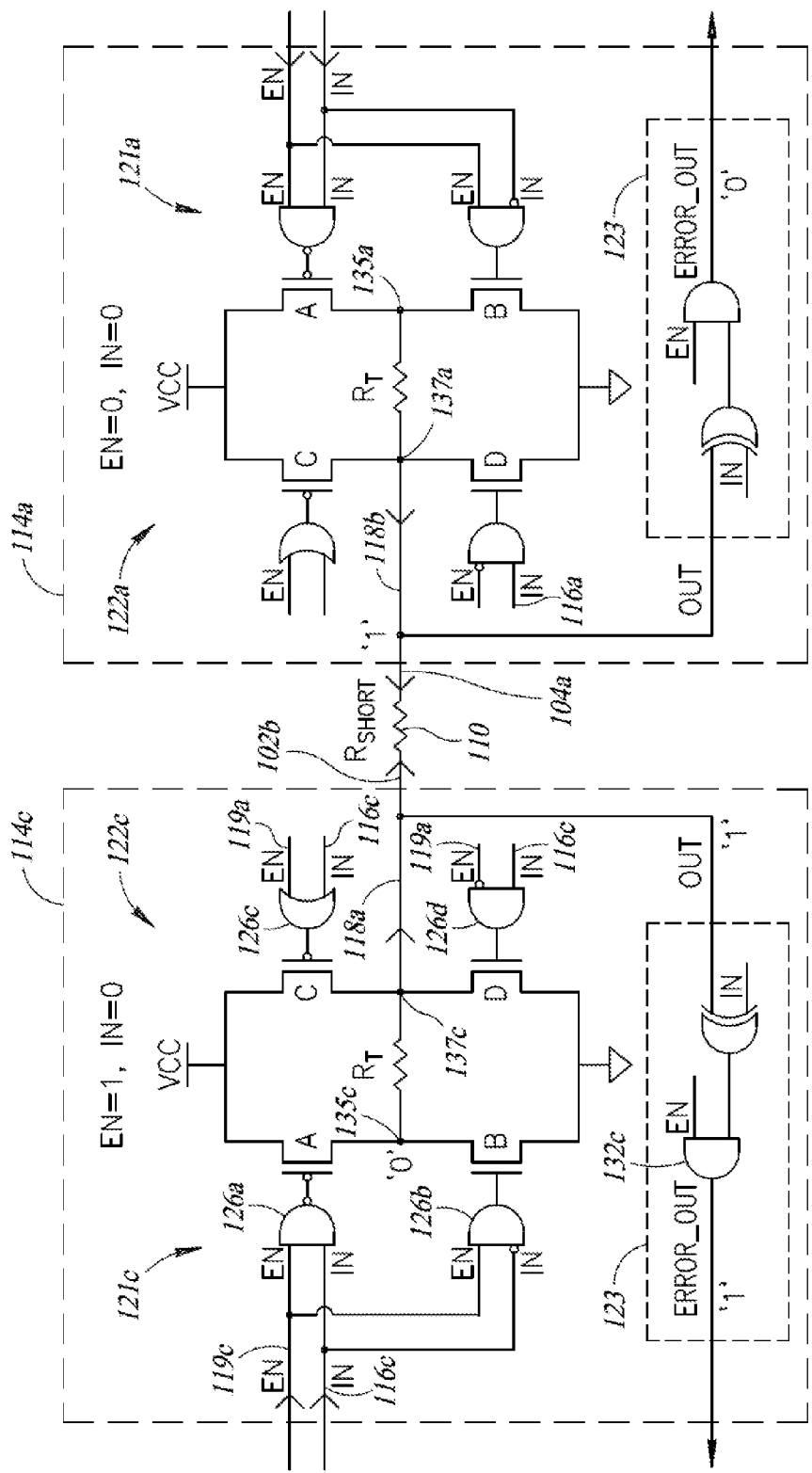
FIG. 6 is a detailed schematic diagram of the short circuit detection circuit shown in FIG. 5 during a short circuit test in which the input to the short circuit detection circuit is set to '0'.
Figure 7:
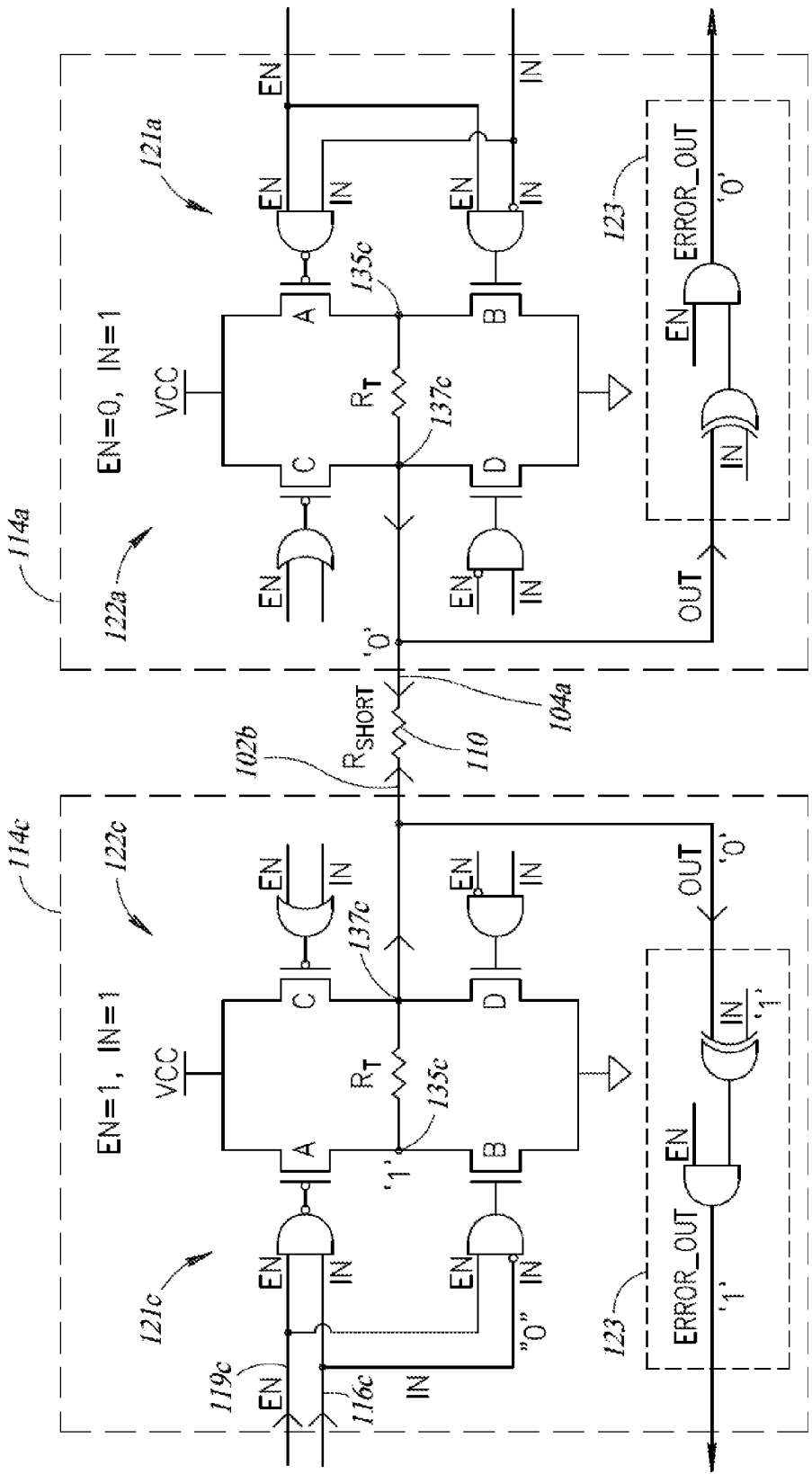
FIG. 7 is a schematic diagram of the short circuit detection circuit shown in FIG. 5 during a short circuit test in which the input to the short circuit detection circuit is set to '1'.

FIG. 5 and the detection test cases shown in FIGS. 6 and 7 serve to illustrate by example operations of the short circuit detection module 112 in identifying force/force, sense/sense, and force/sense short circuits.

FIG. 5 highlights one of the short circuit examples from FIG. 1, in particular, the force/sense short circuit example in which force line 104a is coupled to sense line 102b by the inadvertent inter-layer connection 110. $R_{short}$ represents the resistance associated with the short circuit connection 110. The short circuit detection circuit 114c attempts to drive the line 102b to the input value applied at 116c. The short circuit detection circuit 114a attempts to drive the line 104a to the input value applied at 116a.

FIGS. 6 and 7 illustrate the circuit shown in FIG. 5 in more detail and under test to detect the force/sense short circuit 110. Detection of force/force, sense/sense, and force/sense short circuits is not addressed by the circuit implementations described in U.S. Pat. No. 8,604,798. In particular, FIG. 6 illustrates a test case when IN=0, that is, when the sense line 102b is intended to be driven to a low state. Likewise, FIG. 7 illustrates the test case when IN=1, that is, when the sense line 102b is intended to be driven to a high state. In either test case, when the comparison test is triggered by setting EN=1, the input signal 116 is latched into the first pull up/down stage 121 via the logic gates 126a, 126b, thus switching the transistors A, B appropriately so that the value IN appears at the input node 135c. Furthermore, setting EN=1 causes the transistors C, D to switch off, effectively disabling the second pull up/down stage 122c so that the value of the output node 137, OUT, reflects the logic state of the line being driven. When EN=0 in the comparator stage 123, the output of AND gate 132c is necessarily zero so that no short circuit is indicated, regardless of what is happening in the pull up/down stages 121 and 122.

Figure 8:
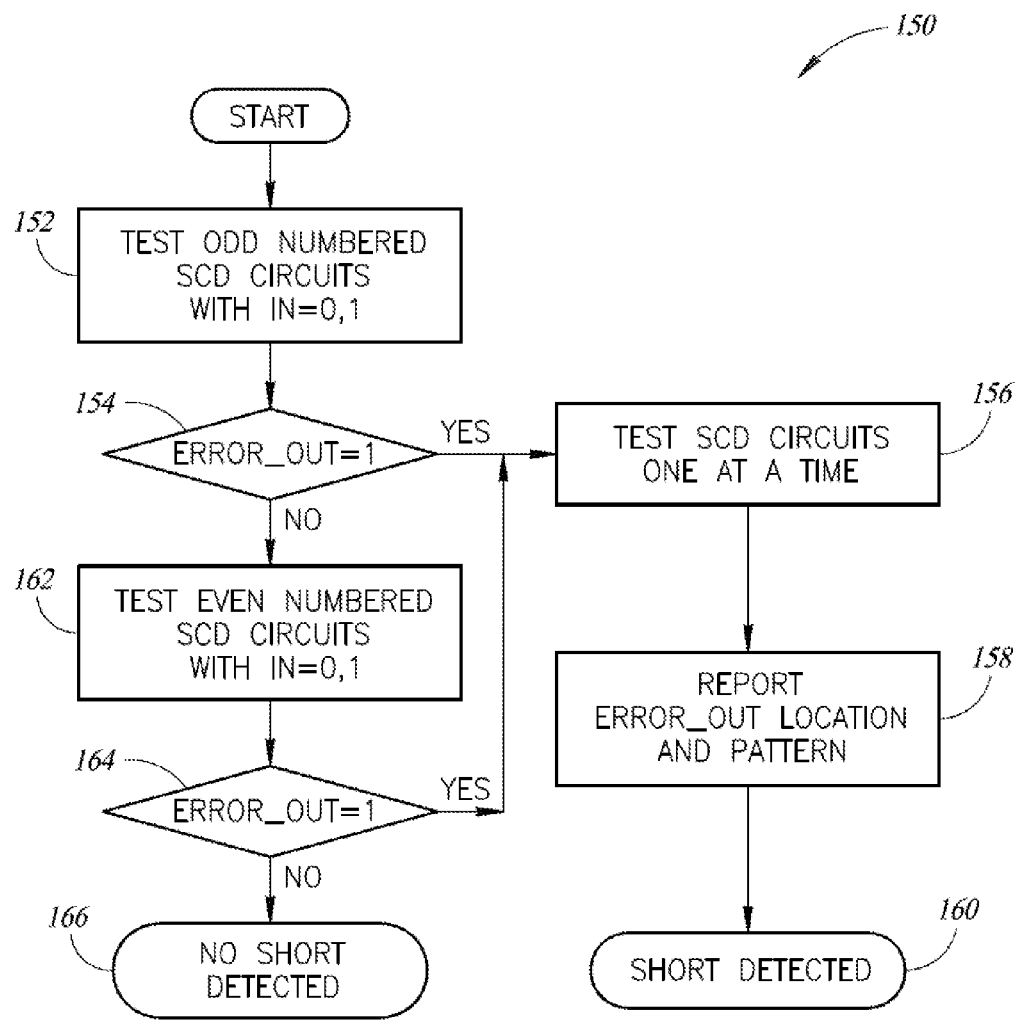
FIG. 8 is a flow diagram showing a sequence of steps in an exemplary method of detecting short circuits in a wire matrix, according to one embodiment described herein.

FIG. 8 illustrates an exemplary embodiment of a testing method 150 that uses the short circuit detection module 112 to detect and locate short circuits in the capacitive sensing matrix 100. The testing method can be automated and carried out by programming a machine, e.g., a microprocessor, to apply input signals to and detect output signals from the various circuits and circuit stages described herein. Other testing methods can also be implemented using the short circuit detection module 112. In the present embodiment, to save testing time, short circuit detection circuits 114 can be turned on alternately to detect whether there is a short circuit present anywhere within the capacitive sensing matrix 100. If a short circuit is detected, the short circuit detection circuits 114 can be enabled in a successive fashion to identify the location and the type of short, e.g., a short to power or ground, or a force/sense short.

At 152, short circuit detection circuits 114 corresponding to every other sense line, or every other force line, e.g., the 1st, 3rd, 5th, and subsequent odd numbered short circuit detection circuits 114, are tested simultaneously by setting EN=1, with IN=0 and with IN=1.

At 154, the value of the error signals 120 are detected. If any one of the error signals 120 is a logic "1" indicating a short circuit is present, the location of the short circuit is sought at 156.

At 156, short circuit detection circuits 114 corresponding to lines adjacent to the line that produced the error signal 20 are tested to detect a force/force or a sense/sense short circuit. If neither one of the adjacent lines produces an error signal 120, orthogonal lines are tested sequentially to detect a force/sense short.

At 158, the error signals 120 are reported and analyzed to determine the location of the short. Since a line-to-line short circuit affects both lines, the short circuit should be detected twice. If two adjacent force or sense lines produce error signals 120, it is deduced that they are shorted together. If one force line and one sense line produce error signals, the matrix coordinates of the unintended electrical connection are deduced.

At 162, if a short has not been found among the odd-numbered lines tested at 152, the even numbered lines are tested simultaneously.

At 164, the value of the error signals 120 are detected. If any one of the error signals 120 is a logic "1" indicating a short circuit is present, the location of the short circuit is sought by executing steps 156-160.

At 166, if none of the error signals 120 is a logic "1" indicating a short circuit, it is concluded that there are no short circuits present in the capacitive sensing matrix 100.

The following logic Tables I-IV show in detail the decision-making process for deducing what type of short circuit is present, and the location of the short circuit, if a short circuit has been detected using a test such as the one described above. Such a decision-making process is carried out using the short circuit detection circuit module 112 described herein. The decision-making process described herein can be automated by programming a computing device to apply test signals to the short circuit detection circuit module 112 and gather error data from the short circuit detection circuit module 112.

Table I is a logic table illustrating a logical progression to deduce the type of short circuit present based on the error signal data from error signals 120, according to one embodiment. In general, when a test of any single line produces an error signal 120 for both input values IN=0 and IN=1, it is concluded that there exists a force/sense short. When a test of any single line produces an error signal 120 for only the case IN=0, it is concluded that the line under test is shorted to $V_{cc}$. Likewise, when a test of any single line produces an error signal 120 for only the case IN=1, it is concluded that the line under test is shorted to ground.

TABLE I

| | | EN | | | | |
|---|---|---|---|---|---|---|
| Time | IN | Force0 | Force1 | Sense0 | Sense1 | ERROR OUT |
| t1 | 0 | 0 | 1 | 0 | 1 | 0 |
| t2 | 1 | 0 | 1 | 0 | 1 | 0 |
| t3 | 0 | 1 | 0 | 1 | 0 | 0 |
| t4 | 1 | 1 | 0 | 1 | 0 | 1 |

Table II is a logic table illustrating a logical progression to deduce the type of short circuit(s) present in a representative capacitive sensing matrix 100, or a portion thereof, having two sense lines, Sense0 and Sense1, and two force lines, Force0 and Force1. If none of the lines produces an error signal 120, it is deduced that no short circuit exists within the capacitive sensing matrix 100. If the four lines represent a portion of a larger capacitive sensing matrix 100, it is deduced that no short circuit exists within the area of the matrix associated with the four lines. If one of the lines, Force0, indicates a short circuit, but only when IN=0, it is deduced that OUT=1 and it is concluded that Force0 is shorted to $V_{cc}$. If one of the lines, Force0, indicates a short circuit, but only when IN=1, it is deduced that OUT=0 and it is concluded that Force0 is shorted to ground. If Force0 and Sense1 both produce an error signal 120 for both input values, IN=0 and IN=1, it is concluded that Force0 and Sense1 are shorted together at the matrix location where the two orthogonal lines coincide. If adjacent lines Force0 and Force1 both produce an error signal 120 for both input values, IN=0 and IN=1, it is concluded that Force0 and Force1 are shorted together, but the exact location of the short circuit along the two lines is not known. If the two adjacent sense lines Sense0 and Sense1 both produce an error signal 120 for both input values, IN=0 and IN=1, and Force0 produces an error signal 120 for both input values, IN=0 and IN=1 as well, it is concluded that all three of the lines Force0, Sense0, and Sense1 are shorted together.

TABLE II

| | | EN | | | | |
|---|---|---|---|---|---|---|
| Time | IN | Force0 | Force1 | Sense0 | Sense1 | ERROR OUT |
| t5 | 0 | 1 | 0 | 0 | 0 | 0 |
| t6 | 1 | 1 | 0 | 0 | 0 | 0 |
| t7 | 0 | 0 | 1 | 0 | 0 | 0 |
| t8 | 1 | 0 | 1 | 0 | 0 | 0 |
| t9 | 0 | 0 | 0 | 1 | 0 | 0 |
| t10 | 1 | 0 | 0 | 1 | 0 | 1 |
| t11 | 0 | 0 | 0 | 0 | 1 | 0 |
| t12 | 1 | 0 | 0 | 0 | 1 | 0 |

Table III illustrates in detail the logic used in step 152 of the testing method 150. Logic states shown in Table III under the column headings for each of the four lines indicate the value of EN at times t1-t4. Thus, at time t1, IN is set to 0, and Force1 and Sense1 are tested by enabling their respective short circuit detection circuits 114 with EN=1; at time t2, Force1 and Sense1 are tested with IN=1; at time t3, Force0 and Sense0 are tested with IN=0; and at time t4, Force0 and Sense0 are tested with IN=1. The only test that produces an error signal is the test at time t4. Because Force0/Sense0 produces an error only when IN=1, and not when IN=0, it is concluded that there is a short to ground. However, it is not known which of the two lines Force0 or Sense0 is the one that is shorted to ground. More tests are necessary to de-convolve the two lines.

TABLE III

| | | EN | | | | |
|---|---|---|---|---|---|---|
| Time | IN | Force0 | Force1 | Sense0 | Sense1 | ERROR OUT |
| t1 | 0 | 0 | 1 | 0 | 1 | 0 |
| t2 | 1 | 0 | 1 | 0 | 1 | 0 |
| t3 | 0 | 1 | 0 | 1 | 0 | 0 |
| t4 | 1 | 1 | 0 | 1 | 0 | 1 |

Table IV shows the results of continued testing at times t5-t12 to determine which one of Force0 or Sense0 is shorted to ground. Each one of the lines is tested individually for both cases IN=0 and IN=1. Because Sense0 is the only line that produces an error signal 120, it is concluded that Sense0 is shorted to ground and Force0 is not.

TABLE IV

| Time | IN | Force0 | Force1 | Sense0 | Sense1 | ERROR OUT |
|------|----|--------|--------|--------|--------|-----------|
| t5   | 0  | 1      | 0      | 0      | 0      | 0         |
| t6   | 1  | 1      | 0      | 0      | 0      | 0         |
| t7   | 0  | 0      | 1      | 0      | 0      | 0         |
| t8   | 1  | 0      | 1      | 0      | 0      | 0         |
| t9   | 0  | 0      | 0      | 1      | 0      | 0         |
| t10  | 1  | 0      | 0      | 1      | 0      | 1         |
| t11  | 0  | 0      | 0      | 0      | 1      | 0         |
| t12  | 1  | 0      | 0      | 0      | 1      | 0         |

EN (spans Force0, Force1, Sense0, Sense1)

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A short circuit detection circuit, comprising:
   a first pull up/down stage;
   a second pull up/down stage coupled to the first pull up/down stage, the first and second pull up/down stages being coupled to accept an input signal at each of the first and second pull up/down stages and, upon receiving an enable signal, generate an output drive signal; and
   a comparator stage coupled to accept the input signal and the output drive signal and, upon receiving the enable signal at each of the first and second pull up/down stages, produce an error signal indicating whether or not a short circuit is present, based on whether or not the output drive signal is at a same logic state as the input signal.

2. The short circuit detection circuit of claim 1, further comprising a resistor coupling the first pull up/down stage to the second pull up/down stage.

3. The short circuit detection circuit of claim 2 wherein the resistor is a variable resistor and an associated short circuit threshold is determined by the variable resistor, the threshold providing a sensitivity adjustment for the short circuit detection circuit.

4. The short circuit detection circuit of claim 1 wherein the comparator stage includes an exclusive OR logic gate to which the input and output signals of the short circuit detection circuit are coupled.

5. The short circuit detection circuit of claim 4 wherein availability of the comparator stage error output is gated by the enable signal.

6. The short circuit detection circuit of claim 1 wherein the first pull up/down stage includes an AND gate coupled to an NMOS transistor and a NAND gate coupled to a PMOS transistor.

7. The short circuit detection circuit of claim 1 wherein the second pull up/down stage includes an AND gate coupled to an NMOS transistor and an OR gate coupled to a PMOS transistor.

8. The short circuit detection circuit of claim 1 wherein the resistor is coupled between the first pull up/down stage and the output signal so that the first pull up/down stage is made weaker than the second pull up/down stage.

9. The short circuit detection circuit of claim 1 wherein error detection is gated by the enable signal.

10. A short circuit detection module comprising a plurality of short circuit detection circuits, each includes the short circuit detection circuit of claim 1 and is coupled to a different line in a capacitive sensing matrix, the short circuit detection module operable to detect a presence of a short circuit between any lines within the capacitive sensing matrix.

11. The short circuit detection module of claim 10 wherein the short circuits detectable by the short circuit detection circuits include one or more of short circuits to ground, short circuits to a power source, short circuits between adjacent lines in the capacitive sensing matrix; and short circuits between orthogonal lines formed in different conductive layers of the capacitive sensing matrix.

12. The short circuit detection module of claim 10, further operable to detect a location of a short circuit present within the capacitive sensing matrix.

13. The short circuit detection module of claim 10, further operable to distinguish among different types short circuits present within the capacitive sensing matrix.

14. A method of detecting and locating short circuits in a wire matrix having a plurality of wires arranged in rows and columns using the short circuit detection module of claim 10, the method comprising:
   coupling one of a plurality of the short circuit detection circuits of the short circuit detection module to each row and column of the wire matrix;
   setting an input to the short circuit detection circuits high; and
   performing a first test of a plurality of rows in the wire matrix simultaneously, using the short circuit detection circuits.

15. The method of claim 14, further comprising:
   setting the input to the short circuit detection circuits low; and
   performing a second test of a plurality of rows in the wire matrix simultaneously, using the short circuit detection circuits.

16. The method of claim 15, further comprising:
   when only the first test indicates a short circuit at a particular row, reporting that the particular row is shorted to a power source; and
   when only the second test indicates a short circuit at a particular row, reporting that the particular row is shorted to ground.

17. The method of claim 16, further comprising:
when the first and second tests both indicate a short circuit at a particular row, reporting that the particular row is shorted to a neighboring wire;
testing additional rows adjacent to the particular row, using the short circuit detection circuits;
when two adjacent rows indicate a short circuit, reporting the two adjacent rows as a location of the short circuit;
performing a serial test of each column of the wire matrix, using the short circuit detection circuits; and
when a particular column indicates a short circuit, reporting a location of the short circuit as matrix coordinates of the particular row and the particular column.

18. An electronic device including the short circuit detection circuit of claim 1, wherein the electronic device includes one or more of a mobile phone, a smart phone, a laptop computer, a tablet computer, a desktop computer, an interactive screen, a vehicle dashboard display, an appliance control panel, a billboard, a monitor, or a television.

19. A computer-readable storage medium storing computer-executable instructions that, when executed by a microprocessor, cause the microprocessor to:
couple one of a plurality of the short circuit detection circuits of the short circuit detection module of claim 10 to each row and column of a wire matrix;
set an input to the short circuit detection circuits high;
perform a first test of every other row in the wire matrix simultaneously, using the short circuit detection circuits;
set the input to the short circuit detection circuits low;
perform a second test of every other row in the wire matrix simultaneously, using the short circuit detection circuits;
when only the first test indicates a short circuit at a particular row, report that the particular row is shorted to a power source;
when only the second test indicates a short circuit at a particular row, report that the particular row is shorted to ground; and
when the first and second tests both indicate a short circuit at a particular row, report that the particular row is shorted to a neighboring wire.

20. The computer-readable storage medium of claim 19, storing instructions that further cause the microprocessor to:
when the first and second tests both indicate a short circuit at a particular row,
test additional rows adjacent to the particular row, using the short circuit detection circuits; and
when two adjacent rows indicate a short circuit,
report the two adjacent rows as a location of the short circuit;
perform a serial test of each column of the wire matrix, using the short circuit detection circuits; and
when a particular column indicates a short circuit, report a location of the short circuit as matrix coordinates of the particular row and the particular column.

* * * * *